United States Patent [19]

Rhodes et al.

[11] Patent Number: 5,283,204
[45] Date of Patent: Feb. 1, 1994

[54] METHOD OF FORMING PASSIVATION OXIDATION FOR IMPROVING CELL LEAKAGE AND CELL AREA

[75] Inventors: Howard E. Rhodes; Tyler A. Lowrey, both of Boise, Id.

[73] Assignee: Micron Semiconductor, Inc., Boise, Id.

[21] Appl. No.: 869,571

[22] Filed: Apr. 15, 1992

[51] Int. Cl.⁵ .............................. H01L 21/76
[52] U.S. Cl. ............................ 437/52; 437/919
[58] Field of Search ................... 437/52, 919; 148/DIG. 109; 257/306, 307, 532

[56] References Cited

U.S. PATENT DOCUMENTS 4,985,718  1/1991  Ishijima .
5,017,982  5/1991  Kobayashi .

FOREIGN PATENT DOCUMENTS 1-80060  3/1989  Japan .

*Primary Examiner*—George Fourson
*Attorney, Agent, or Firm*—David J. Paul

[57] ABSTRACT

The invention is directed to maximizing storage cell surface area in a high density/high volume DRAM (dynamic random access memory) fabrication process. Fabrication methods are disclosed that, when used with existing capacitor fabrication processes, will reduce cell leakage and allow for increased capacitance. The present invention corrects any severed storage node poly that may have resulted from a misalignment of a masking pattern used for defining future buried contacts by placing passivation oxidation over the existing wafer surface which, in effect, seals off the severed storage node poly form the capacitor's top cell plate poly. The passivation oxidation prevents cell plate to plate leakage while protecting the severed storage node poly from subsequent deposition of conductive layers.

26 Claims, 3 Drawing Sheets

METHOD OF FORMING PASSIVATION OXIDATION FOR IMPROVING CELL LEAKAGE AND CELL AREA

FIELD OF THE INVENTION

This invention relates to semiconductor circuit memory storage devices and more particularly to a process used in conjunction with fabrication of capacitor structures that may be used in such storage devices as high-density dynamic random access memories (DRAMs).

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, a problem may occur during the final processing steps when a buried contact is required to make contact to the substrate between fabricated storage capacitors (particularly stacked capacitors that are fabricated by any process steps). If the masking alignment used to define the buried contact isn't precise when the contact opening is etched, a portion of the storage node plate may be severed. Once this happens, there is an exposed interface between the capacitor's cell plates that lends itself to future plate to plate leakage.

The present invention improves existing capacitor fabrication processes, and in particular stacked capacitor processes, by optimizing a capacitor cell with passivation oxidation techniques that improve cell leakage and maintain cell area.

SUMMARY OF THE INVENTION

The invention is directed to maximizing storage cell surface area in a high density/high volume DRAM (dynamic random access memory) fabrication process. A fabrication method is disclosed that when used with existing capacitor fabrication processes will reduce cell leakage and allow for increased capacitance. The method of the present invention is used in stacked capacitor storage cell fabrication that is used in a DRAM process, however it will be evident to one skilled in the art to incorporate these steps into other capacitor processes requiring volatile memory cells, such as VRAMs or the like.

After a silicon wafer is prepared using conventional process steps, and the storage cell of a given capacitor process is created (cell plate, cell dielectric and common cell plate have been fabricated) the wafer is ready for a next stage of fabrication wherein connections to periphery circuit connections, power supply lines, etc., are to be constructed.

After the common cell plate (referred to as the top cell plate) has been deposited (usually polysilicon), a masking layer (such as photoresist) is placed and patterned to overlie the desired adjacent wordlines in the memory array, which exhibit neighboring storage node plates. The patterned masking layer allows access to a portion of the underlying top cell plate which is removed by a subsequent etch step. The alignment of the patterned masking layer may allow the edges of the storage node plate to become severed during the etch step and thereby expose an edge of the storage node plate. A subsequent spacer etch follows the dry poly etch which is in turn followed by a source/drain implant (usually N+).

At this point, the present invention corrects any severed storage node plates that may have resulted from a misalignment of the patterned resist by placing passivation oxidation over the existing wafer surface which, in effect, seals off the severed storage node plate and protects it from subsequent deposition of conductive layers.

DETAILED DESCRIPTION OF THE PREFERRED EMBODIMENTS

The invention is directed to maximizing storage cell surface area, as well as providing uniform and repeatable, defect free, storage cell structures across a given substrate, in a high density/high volume DRAM fabrication process.

A silicon wafer is prepared using conventional process steps to fabricate a capacitor structure (as an example a stacked capacitor structure) in which the storage capacitor of each memory cell will make contact directly to an underlying diffusion area. Each underlying diffusion area will have two storage node connections isolated from a single digit line contact by access transistors formed by poly word lines crossing the active area. Normally each diffusion area within the array is isolated from one another by a thick field oxide. The diffusion areas can be arranged in interdigitated columns and non-interdigitated rows or simply parallel and in line to one another in both the vertical and horizontal directions. As previously mentioned, the diffusion areas are used to form active MOS transistors (serving as access transistors to each individual capacitor) that can be doped as NMOS or PMOS type FETs depending on the desired use.

Figure 1:
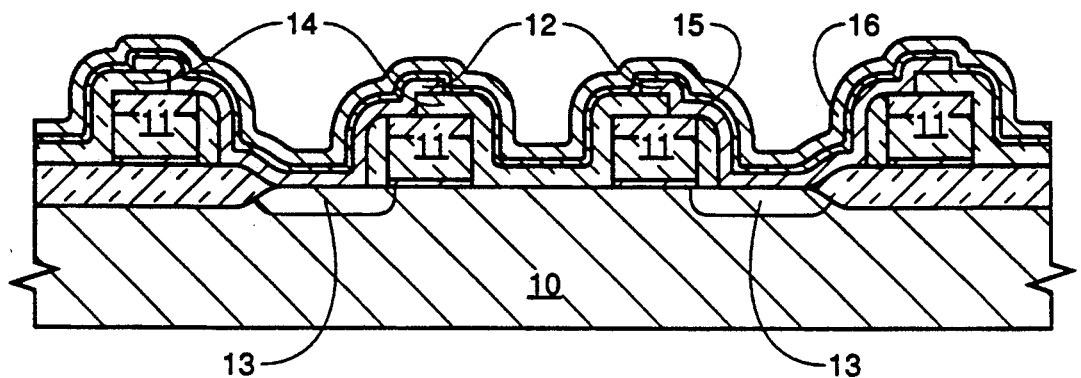
FIG. 1 is a composite cross-sectional view of neighboring stacked capacitors overlying wordlines and connecting to conductively doped diffusion areas.

FIG. 1 shows two neighboring stacked capacitors comprising a starting substrate 10 on which parallel wordlines 11 have been fabricated. Between the two pairs of wordlines 11, a storage node poly (in this process referred to as poly2) has been deposited, thereby connecting to diffusion areas 13 and then subsequently patterned to form separate storage node poly plates 12. Cell dielectric 15 blankets storage node poly plates 12 and a subsequent deposition of poly 16 covers the entire memory array to complete the formation of the stacked capacitors. As can be seen, dielectric 14 has previously been formed to overlie substrate 10 to prevent later formed common plate poly 16 (or poly3) from coming in contact with substrate 10.

Figure 2:
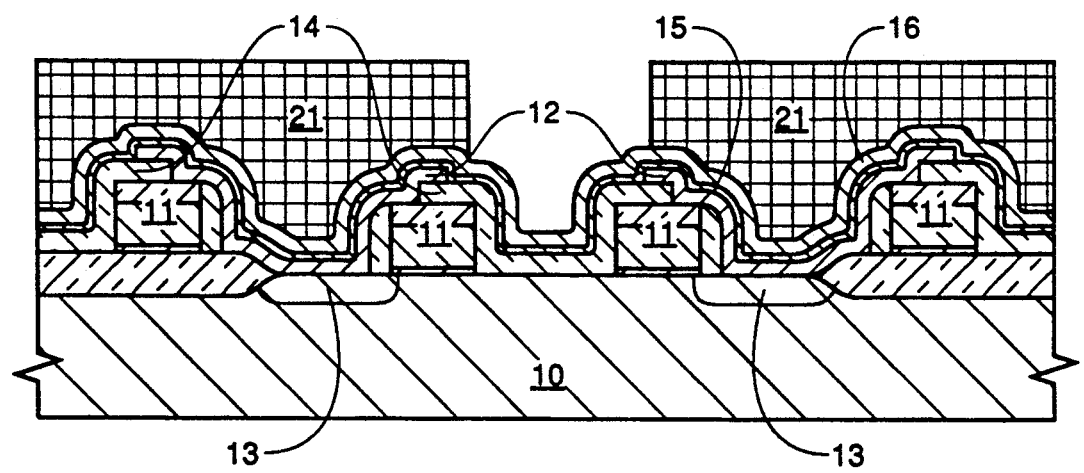
FIG. 2 is a cross-sectional view of the in-process wafer portion of FIG. 1 after placing and patterning of a photoresist to define the cell poly (or top plate electrode)

As seen in FIG. 2, photoresist 21 has been placed and patterned over the memory array such that the patterned areas define holes in the cell poly for desired contact openings for future periphery connections. These openings expose the underlying poly3 and makes it available to a subsequent etch. Notice that ideally the openings in resist 21 should provide access to the desired substrate location between to adjacent wordlines and yet prevent the possibility of future severing of the storage node poly 12 during subsequent etching steps. However, precise alignment is difficult to obtain due to minute alignment tolerances allowed between storage nodes of today's dense memory arrays and misalignment is unavoidable. The methods of the present invention makes this misalignment tolerable as is described in the preferred embodiment that follows.

Figure 3:
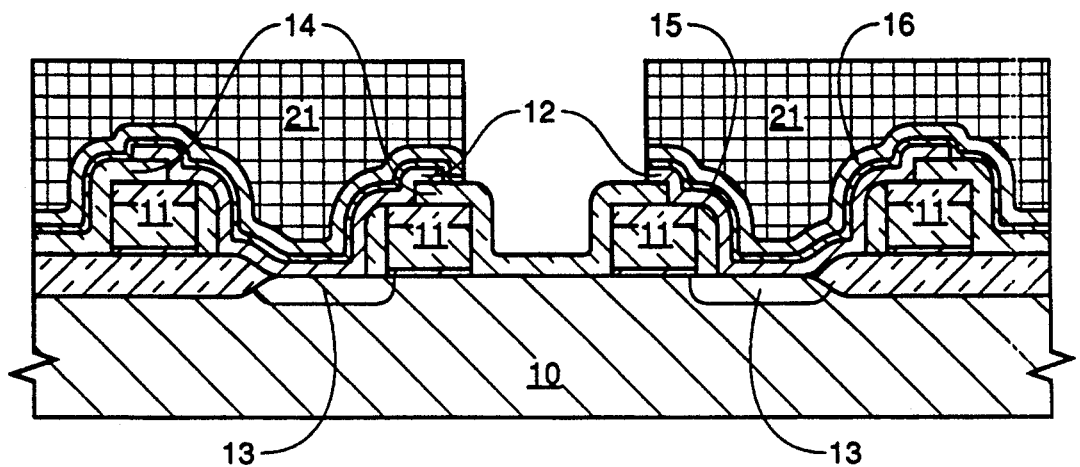
FIG. 3 is a cross-sectional view of the in-process wafer portion of FIG. 2 after a polysilicon etch step.

As seen in FIG. 3, a dry poly3 etch step has removed exposed poly3 and due to misalignment of patterned resist 21, an end of storage poly 12 is also severed, thereby exposing storage node poly 12. At this point, if not somehow isolated, the severed end of storage node poly 12 presents at worse case a shorted node or at best case a leaky capacitor cell, depending on the steps that follow.

Figure 4:
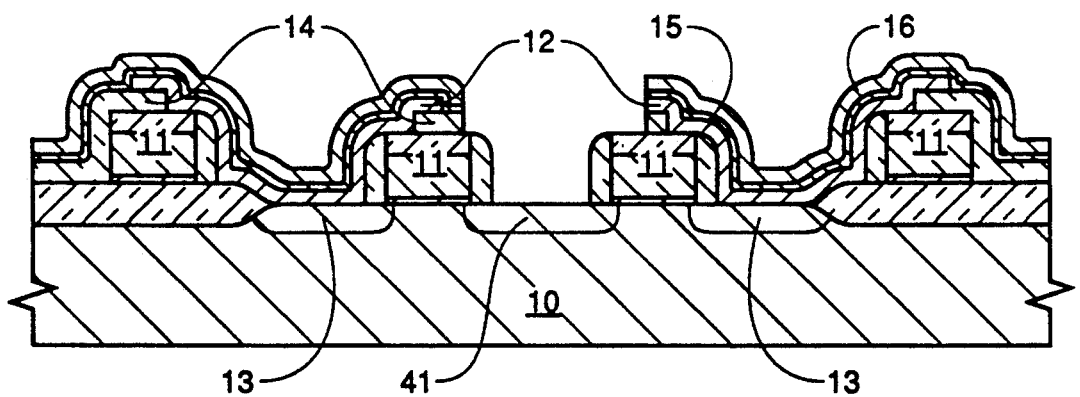
FIG. 4 is a cross-sectional view of the in-process wafer portion of FIG. 3 following a spacer etch step, a resist strip and a N+ source/drain implant.
Figure 5:
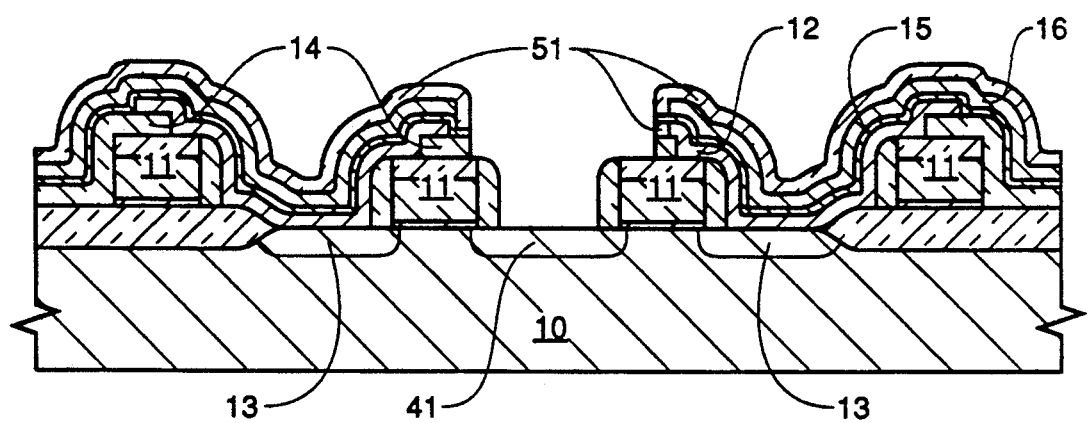
FIG. 5 is a cross-sectional view of the in-process wafer portion of FIG. 4 following a passivation oxidation of any exposed storage node poly and the etched edges of the top poly cell plate.

The present invention provides a method to make the above mentioned misalignment tolerable while maintaining storage cell capacitance as well as preventing cell leakage as presented in FIGS. 4 and 5.

Referring now to FIG. 4, a spacer etch step is performed on dielectric 14 thereby exposing underlying substrate 10. Next resist 21 (seen in FIG. 3) is stripped and a source/drain implant (N+ in this case) is performed to form diffusion area 41 in substrate 10.

Referring now to FIG. 5, the wafer is subjected to oxidation passivation 51 to seal the poly2/poly3 interface. Oxidation passivation 51 may be specifically formed after a source/drain implant (HD implant in this case) is performed to form diffusion area 41 in substrate 10. Next, the wafer is subjected to oxidation during an implant annealing step which passivates the poly2/poly3 interface while the implant impurities are forced deeper into substrate 10. Though an effective oxidation passivation can be obtained using either a wet or dry oxidation step in a temperature range of 700°-900° C., it is preferred to perform this step by wet oxidation at a temperature of approximately 800° C. Passivation 51 now prevents any leakage between storage node poly2 and poly3 and allows capacitance to be maintained.

A major significance of relying on passivation oxidation to seal the poly2/poly3 interface now becomes apparent because poly3 (16) no longer needs to completely cover poly2 (12), more storage node plate surface area is gained as the edges of poly2 plates 12 may now be patterned closer together.

It is to be understood that although the present invention has been described with reference to a preferred embodiment, various modifications, known to those skilled in the art, may be made to the process steps presented herein without departing from the invention as recited in the several claims appended hereto.

We claim:

1. A process for isolating first and second conductive plates of a storage capacitor fabricated on a starting substrate, said process comprising the steps of:
   a) providing a mask having an opening aligned over a desired buried contact location between neighboring capacitor storage node plates and a pair of parallel conductive access lines thereby exposing a portion of said capacitor's second conductive plate;
   b) removing said second conductive plate's exposed portion and an underlying portion of a cell dielectric layer thereby exposing an underlying insulating layer, said removal of second conductive plate's exposed portion and said underlying portion of said cell dielectric layer thereby exposes and severs a portion of said first conductive plate resulting from a misalignment of said mask opening;
   c) removing said insulative layer thereby exposing a portion of the starting substrate and forming insulative spacers on walls of said pair of parallel conductive access lines;
   d) removing said mask;
   e) introducing conductive impurities into said exposed starting substrate;
   f) oxidizing the resulting surface prior to an annealing step, said annealing step drives said conductive impurities deeper into said exposed starting substrate, said oxidation insulates said severed portions of said first conductive plate.

2. A process as recited in claim 1, wherein said oxidizing step is a wet oxidation step.

3. A process as recited in claim 1, wherein said oxidizing step is a dry oxidation step.

4. A process as recited in claim 1, wherein said annealing step is performed at a temperature range of approximately 700°-900° C.

5. A process as recited in claim 1, wherein said annealing step is performed at a temperature of approximately 800° C.

6. A process as recited in claim 1, wherein said first and second conductive plates are doped polysilicon.

7. A process as recited in claim 1, wherein the storage capacitor comprises a stacked capacitor.

8. A process as recited in claim 1, wherein said starting substrate is a silicon substrate.

9. A process as recited in claim 1, wherein the mask comprises a photoresist layer.

10. A process as recited in claim 1, wherein said parallel conductive access lines are wordlines in dynamic random access memory.

11. A process for isolating first and second conductive plates of a DRAM storage capacitor fabricated on a silicon substrate, said process comprising the steps of:

a) providing a mask having an opening aligned over a desired buried contact location between neighboring capacitor storage node plates and a pair of parallel conductive access lines thereby exposing a portion of said capacitor's second conductive plate;

b) removing said second conductive plate's exposed portion and an underlying portion of a cell dielectric layer thereby exposing an underlying insulating layer, said removal of second conductive plate's exposed portion and said underlying portion of said cell dielectric layer thereby exposes and severs a portion of said first conductive plate resulting from a misalignment of said mask opening;

c) removing said insulative layer thereby exposing a portion of the silicon substrate and forming insulative spacers on walls of said pair of parallel conductive wordlines;

d) removing said mask;

e) introducing conductive impurities into said exposed starting substrate;

f) oxidizing the resulting surface prior to an annealing step, said annealing step drives said conductive impurities deeper into said exposed silicon substrate, said oxidation insulates said severed portions of said first conductive plate.

12. A process as recited in claim 11, wherein said oxidizing step is a wet oxidation step.

13. A process as recited in claim 11, wherein said oxidizing is a dry oxidation step.

14. A process as recited in claim 11, wherein said annealing step is performed at a temperature range of approximately 700°–900° C.

15. A process as recited in claim 11, wherein said annealing step is performed at a temperature of approximately 800° C.

16. A process as recited in claim 11, wherein said first and second conductive plates are doped polysilicon.

17. A process as recited in claim 11, wherein the storage capacitor comprises a stacked capacitor.

18. A process as recited in claim 11, wherein the mask comprises a photoresist layer.

19. A process for isolating first and second conductive plates of a DRAM storage capacitor fabricated on a silicon substrate, said process comprising the steps of:

a) providing a mask having an opening aligned over a desired buried contact location between neighboring capacitor storage node plates and a pair of parallel conductive access lines thereby exposing a portion of said capacitor's second conductive plate;

b) removing said second conductive plate's exposed portion and an underlying portion of a cell dielectric layer thereby exposing an underlying insulating layer, said removal of second conductive plate's exposed portion and said underlying portion of said cell dielectric layer thereby exposes and severs a portion of said first conductive plate resulting from a misalignment of said mask opening;

c) removing said insulative layer thereby exposing a portion of the silicon substrate and forming insulative spacers on walls of said pair of parallel conductive wordlines;

d) removing said mask;

e) introducing conductive impurities into said exposed starting substrate;

f) oxidizing said surface during an annealing step, said annealing step drives said conductive impurities deeper into said exposed starting substrate.

20. A process as recited in claim 19, wherein said oxidizing step is a wet oxidation step.

21. A process as recited in claim 19, wherein said oxidizing step is a dry oxidation step.

22. A process as recited in claim 19, wherein said annealing step is performed at a temperature range of approximately 700°–900° C.

23. A process as recited in claim 19, wherein said annealing step is performed at a temperature of approximately 800° C.

24. A process as recited in claim 19, wherein said first and second conductive plates are doped polysilicon.

25. A process as recited in claim 19, wherein the storage capacitor comprises a stacked capacitor.

26. A process as recited in claim 19, wherein the mask comprises a photoresist layer.

* * * * *